United States Patent
Wang et al.

(10) Patent No.: US 7,151,271 B2
(45) Date of Patent: Dec. 19, 2006

(54) SYSTEM AND METHOD FOR PASSING HIGH ENERGY PARTICLES THROUGH A MASK

(75) Inventors: Chao-Hsiung Wang, Hsinchu (TW);
Denny Tang, Saratoga, CA (US);
Wen-Chin Lin, Hsin-Chu (TW);
Li-Shyue Lai, Jhubei (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 377 days.

(21) Appl. No.: 10/681,541

(22) Filed: Oct. 8, 2003

(65) Prior Publication Data

US 2005/0077485 A1    Apr. 14, 2005

(51) Int. Cl.
*A61N 5/00* (2006.01)
*G21G 5/00* (2006.01)
(52) U.S. Cl. .................. 250/492.1; 250/492.1
(58) Field of Classification Search ............. 250/491.1, 250/492.2, 492.1
See application file for complete search history.

(56) References Cited

U.S. PATENT DOCUMENTS 4,254,174 A * 3/1981 Flanders et al. ............ 428/209
4,548,883 A * 10/1985 Wagner ......................... 430/5
5,150,391 A * 9/1992 Ebinuma et al. ............. 378/34

* cited by examiner

Primary Examiner—Jack Berman
Assistant Examiner—Jennifer Yantorno
(74) Attorney, Agent, or Firm—Duane Morris LLP

(57) ABSTRACT

A method and system is disclosed for concentrating high energy particles on a predetermined area on a target semiconductor substrate. A high energy source for generating a predetermined amount of high energy particles, and an electro-magnetic radiation source for generating low energy beams are used together. The system also uses a mask set having at least one mask with at least one alignment area and at least one mask target area thereon, the mask target area passing more high energy particles then any other area of the mask. At least one protection shield is incorporated in the system for protecting the alignment area from being exposed to the high energy particles, wherein the mask is aligned with the predetermined target semiconductor substrate by passing the low energy beams through the alignment area, wherein the high energy particles generated by the high energy source pass through the mask target area to land on the predetermined area on the target semiconductor substrate.

32 Claims, 7 Drawing Sheets

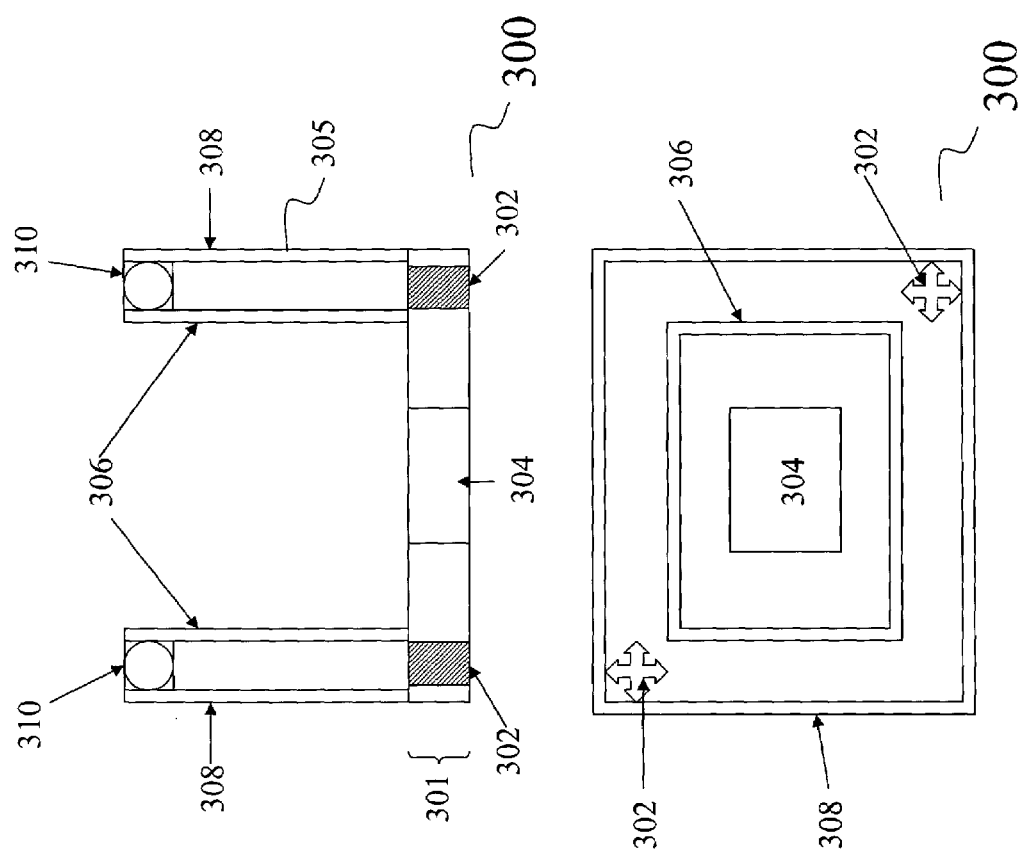

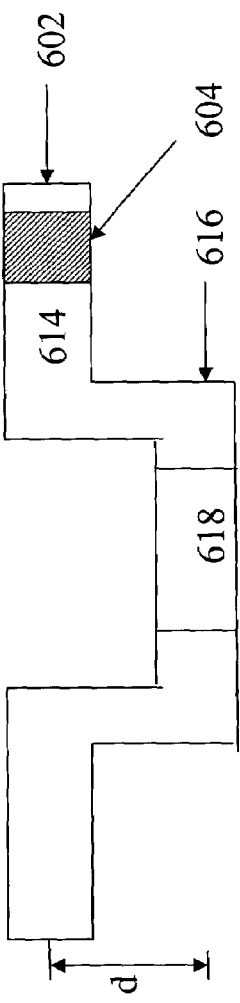
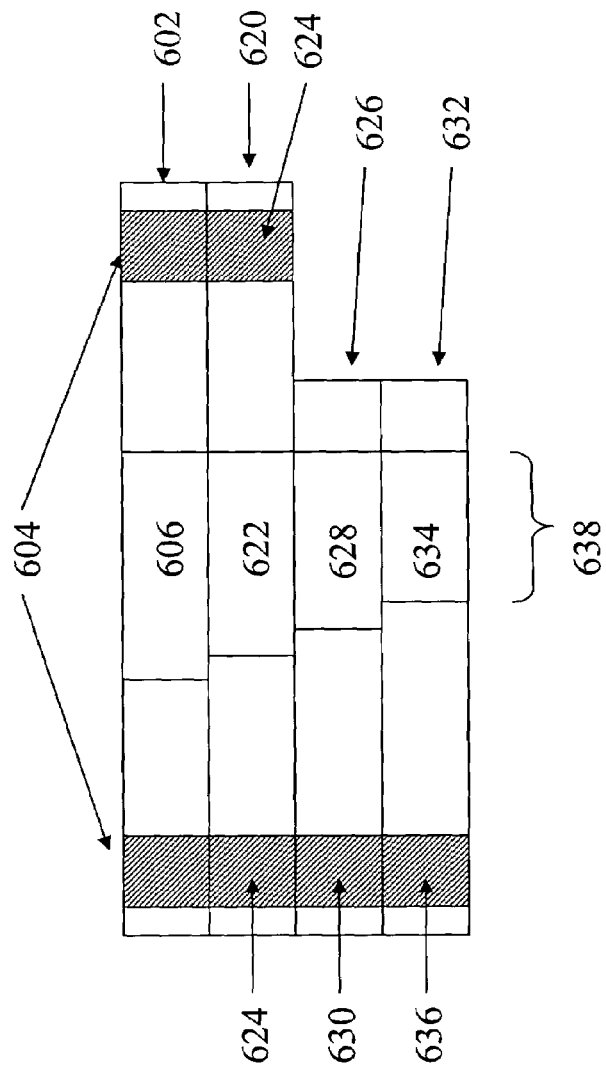
Fig. 6c
Fig. 6d

SYSTEM AND METHOD FOR PASSING HIGH ENERGY PARTICLES THROUGH A MASK

BACKGROUND

The present disclosure relates to charged particle beam microlithography systems used for the fabrication of integrated circuits. More specifically, the disclosure pertains to the systems and methods for passing high energy charged particles through mask reticles and the alignment of the particle beams to wafers within the microlithography systems.

The manufacture of integrated (IC) circuits requires the use of many microlithography process steps to define and create specific circuit patterns and components onto the semiconductor wafer. As IC device performance demands migrate to higher levels, lithography technology has evolved both to higher performance levels as well as to new and additional process applications. Microlithography has expanded from the traditional use of photo energy to transfer circuit/component images onto the wafer substrate, to the use of charged particle beams such as electron, proton and molecular beams for both circuit imaging and substrate modifications. For example, high performance ICs may require the fabrication of semi-insulator regions on a wafer for improved circuit/component isolation, high Q inductors for high signal frequency stability and high resistance structures for specific circuit components. Charged particle beam (CPB) microlithographic processes are commonly used to fabricate the above said regions and components.

FIG. 1 illustrates a conventional charged particle beam (CPB) microlithography system 100. Such system comprises of a CPB source 102 to generate a charged particle beam to travel through the microlithography system along the particle beam axis 104 within the system to eventually strike the wafer 106 located on a wafer stage 108. After exiting from the source 102, the CPB 110 may pass through, if needed, various beam apertures 112 and beam lens/deflection subsystems 114 before transmission through a mask reticle 116 that is mounted upon a mask stage 118. After passing through the mask reticle, the now imaged CPB may pass through additional beam lens subsystems 120 to focus and project the CPB onto the target wafer 106. It is noted that various CPB microlithography systems may incorporate various beamline designs such that apertures 112 and beam lens subsystems 114 and 120 may be of different quantities, designs and lengths.

FIG. 2a is a side view and FIG. 2b is a top view of a typical mask reticle used within conventional CPB microlithography systems. The mask reticle 200 features at least two alignment markers 202 used for the purpose of aligning the mask reticle 200 with a wafer so that the mask pattern image(s) on the mask reticle 200 is aligned to a predetermined targeted substrate area on the wafer. The mask pattern image(s) is usually located within a mask target area 204 by which the CPB is transmitted through. The mask target area 204 is usually the center area of the mask reticle 200, and the alignment markers 202 are located in outside perimeter areas.

For conventional CPB systems employing high energy particle beams such as proton beams greater than certain level of energy (i.e., 3 MeV (million electron-volts)), there are serious issues associated with the use of such proton beams. High energy particles are particles projected at higher velocities and of higher power, generating additional heat loads for the CPB system. Heat from the CPB induced upon the system may cause damage to the system components enough to disturb the alignment integrity of the imaged beam to the targeted wafer. Heat damage to the imaging mask reticle may result with distorted, improper images on the wafer.

Referring back to FIG. 1, the higher energy particles may have more divergence upon exit from the aperture 112 as well as the mask reticle, enough to create distorted, improper images onto the wafer. Furthermore, there is no good controlling mechanism like the deflection subsystem 114 to control the flow of the particles. Also, the distance 122 between the mask reticle 116 and the wafer 106 in a conventional system tends to be too big to handle high energy particles due to the divergence.

In addition, high energy CPBs may produce higher levels of incidental harmful nuclear radiation emitting throughout the system, especially on the mask reticle itself. As the mask reticles are placed and transferred to different locations in the manufacturing facilities, they may cause great concerns when they become radiation sources. Further, the current mask reticle or other masking materials associated therewith are not well suited for precisely controlling and transmitting the proper collective beam energy upon each predetermined area of the wafer.

What is needed is an improved method and system for sufficiently and efficiently resolving the above issues related to the use of high energy CPBs.

SUMMARY

A method and system is disclosed for concentrating high energy particles on a predetermined area on a target semiconductor substrate. A high energy source for generating a predetermined amount of high energy particles, and an electro-magnetic radiation source for generating low energy beams/waves/particles (such as laser, ultraviolet, infrared, or microwave) are used together. The system also uses a mask set having at least one mask with at least one alignment area and at least one mask target area thereon, the mask target area passing more high energy particles then any other area of the mask. At least one protection shield is incorporated in the system for protecting the alignment area from being exposed to the high energy particles, wherein the mask is optically aligned with the predetermined target semiconductor substrate using the low energy beams, wherein the high energy particles generated by the high energy source pass through the mask target area to land on the predetermined area on the target semiconductor substrate.

One application for using such an improved system is for generating semi-insulator area on a semiconductor wafer.

These and other aspects and advantages will become apparent from the following detailed description, taken in conjunction with the accompanying drawings, illustrating by way of example the principles of the disclosure.

BRIEF DESCRIPTION OF THE DRAWINGS

FIGS. 3a and 3b illustrate a mask reticle with an incorporated mask-wafer alignment structure in accordance with one example of the present disclosure.

FIGS. 6a to 6d illustrate four different examples of specific mask reticle designs compatible with the high energy charged particle beams in accordance with the present disclosure.

DESCRIPTION

Figure 1:
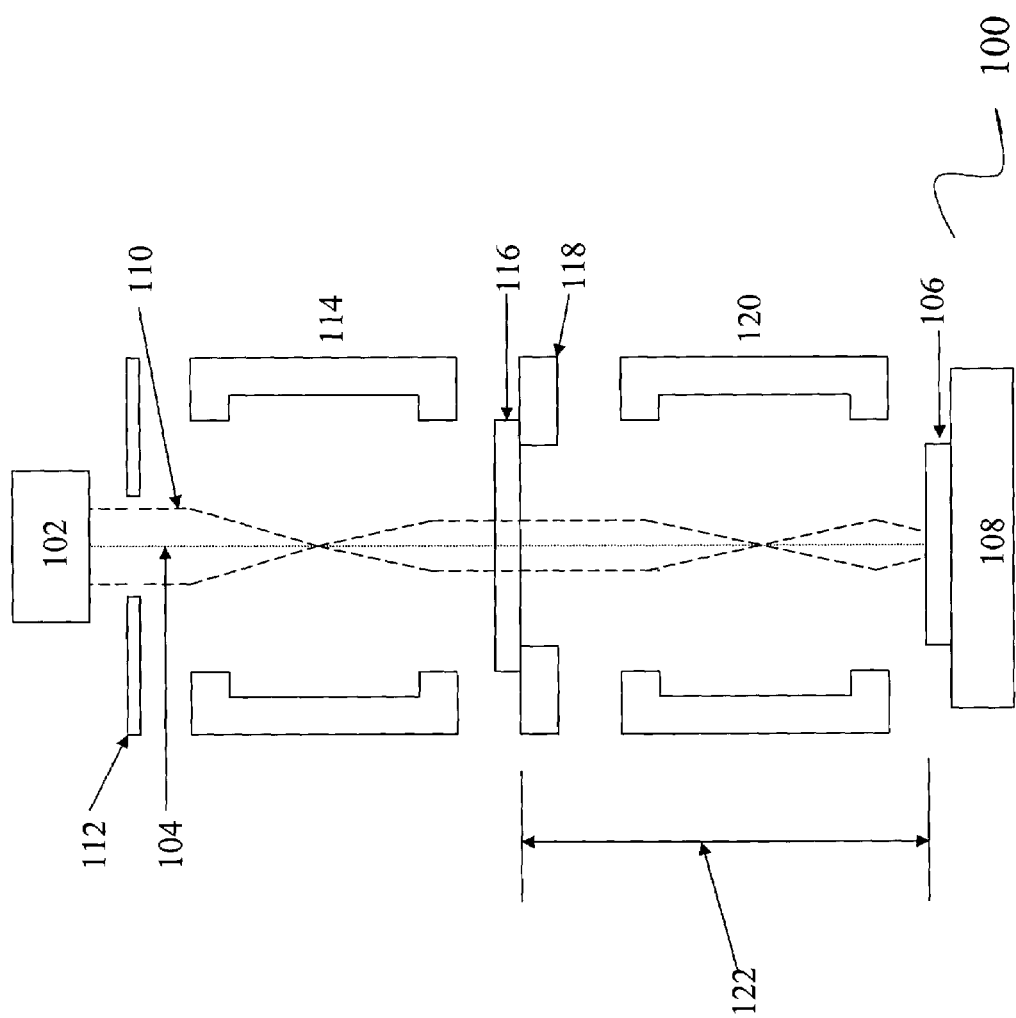
FIG. 1 illustrates a conventional charged particle beam microlithography system.
Figures 2A, 2B:
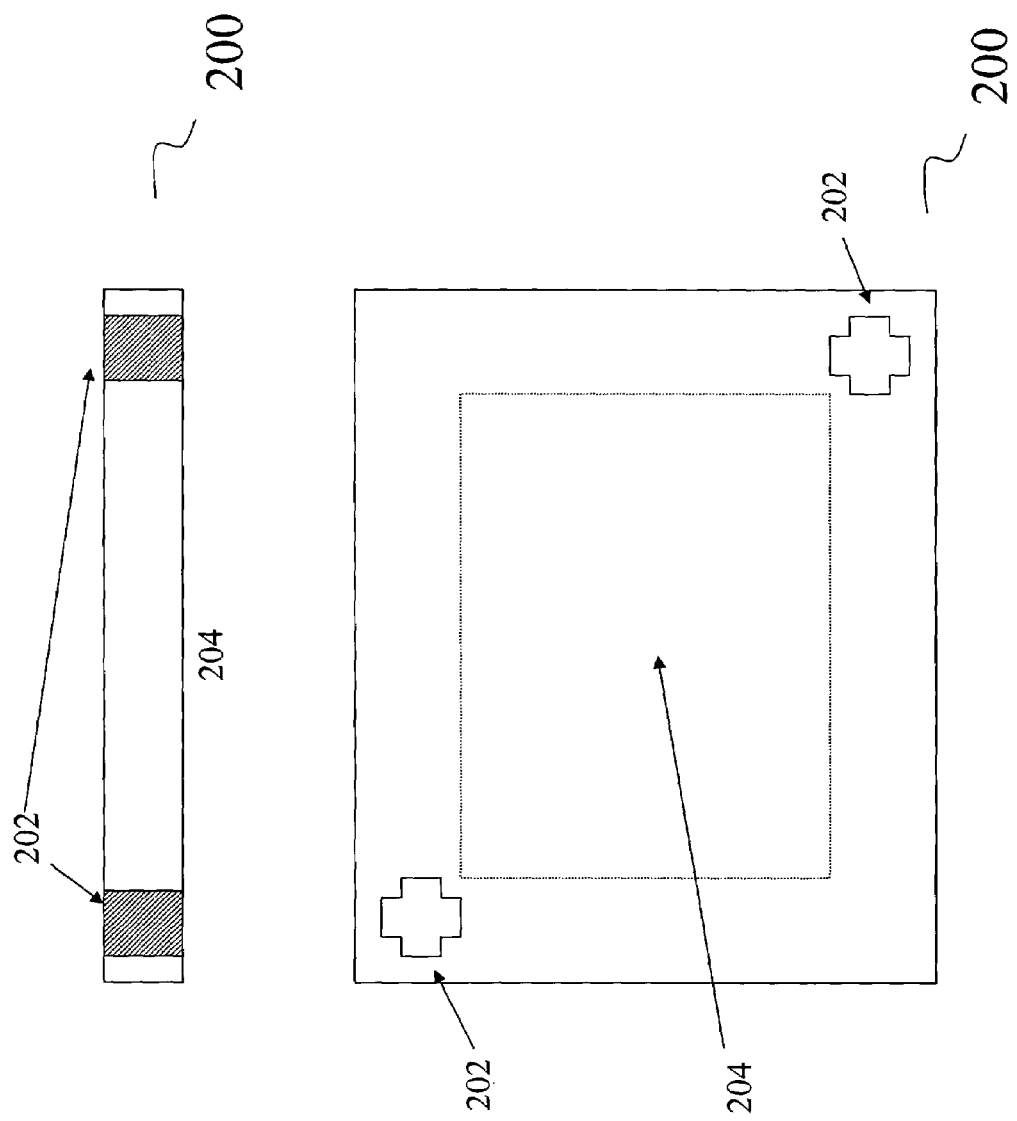
FIGS. 2a and 2b illustrate a conventional mask reticle used within a conventional charged particle beam microlithography system.

The present disclosure provides a CPB system incorporating an energy source such as a low energy electro-magnetic radiation (LEEMR) source and detector system for the purpose of maintaining mask-reticle-to-substrate-wafer alignment during the usage of high energy charged particle beams within microlithography systems. Several examples of LEEMR implementations as well as several examples of mask reticle designs suitable for use with high energy CPB microlithography systems are described in accordance with the present disclosure. The LEEMR source may be a laser, ultraviolet, infrared, or microwave source. The disclosed CPB method and system results in a longer life span for the system components and mask reticles. The process integrity, control and yields of the microlithography operation will be higher. Also, overall system safety, maintainability and complexity will be simpler with reduced operational costs.

Since to make a semi-insulator area on a semiconductor wafer requires such a high energy CPB microlithography, the present disclosure is further described below in the context of making a semi-insulator area on a semiconductor wafer.

FIGS. 3a and 3b illustrate the side sectional and top views of a mask-to-wafer alignment subsystem 300 in accordance with the present disclosure. The mask reticle 301 is generally constructed from solid material such as silicon and/or quartz. Two alignment markers 302 are located at predetermined locations, generally in the perimeter of the mask substrate as shown. A mask target area 304 is located within the perimeter defined by the alignment subsystem 305. The mask target area 304 is a special area which the CPB is expected to be transmitted through.

Protection shields 306 and 308 are placed adjacent to the mask reticle's alignment markers 302, positioned to receive and confine therebetween the oncoming particle beam from above. Protection shield 306 is located towards the center portion of the mask reticle, defining an area surrounding the mask target area 304. Protection shield 308 is located adjacent to the outer edge of the mask reticle so as to keep the alignment markers 302 between the protection shields 306 and 308. There are LEEMR sources/detectors 310 (shown in FIG. 3a but not shown in FIG. 3b) located at one end of the extended protection shields, also positioned between the inner and outer protection shields (306 and 308 respectively). For example, the LEEMR source/detector 310 is located directly above each of the mask reticle's alignment markers 302 along an axis parallel to the CPB axis. The LEEMR sources/detectors 310, positioned within the cavity area formed by the inner and outer protection shields 306 and 308, are thus protected from direct exposure to the CPB. The LEEMR sources may produce low energy beams such as laser beam, ultraviolet beams, infrared beams, microwave, etc. For the purpose of this disclosure, the term "low energy beam" shall represent and include low energy particles, waves or other similar forms of low energy radiations. The energy level may vary, but, at the very least, the LEEMR is not allowed to have a damaging impact on the mask reticle.

The LEEMR sources/detectors 310 are used to facilitate the alignment of the mask target area 304 to the targeted wafer within the CPB microlithography system. The LEEMR sources/detectors 310 generate and/or detect photo-electro-magnetic emissions. When used with the fabricated alignment marks 302 on the mask reticles and wafers, the LEEMR assembly 300 can be used to detect and determine the relative alignment positions between the two. It is noted that the alignment mark areas 302 of the mask reticles and wafers are fabricated such that the reflective and/or transmissive properties within the alignment areas are significantly different from the properties of the immediate surrounding areas, enough for the LEEMR sources/detectors 310 to sufficiently discern alignment positions.

The use of LEEMR source/detectors within the high energy CPB microlithography system will aid the system's ability to detect and adjust for mask reticle to wafer alignment issues due to high heat and radiation loads. The protective shielding prohibits the high energy CPB from interfering with the alignment operation by confining the CPB to stay within or closely around the mask target area. Additionally, the shields 306 and 308 provide heat sinking function for the mask reticle as well as radiation shielding between the CPB and other components of the microlithography system. It is noted that the described examples for the present disclosure show the protection shields physically attached to the mask reticle. Other embodiments of the present disclosure may not require the protection shields to be specifically attached to the mask reticle. Further, although in the example shown here, each shield is a heat sink itself, it is understood that the protection shields may have separate heat sinks attached thereto. In the situation where the shields are not attached to the mask reticle directly, the heat sinks may still contact the mask for absorbing and dissipating the unwanted heat from the mask.

Figure 4C:
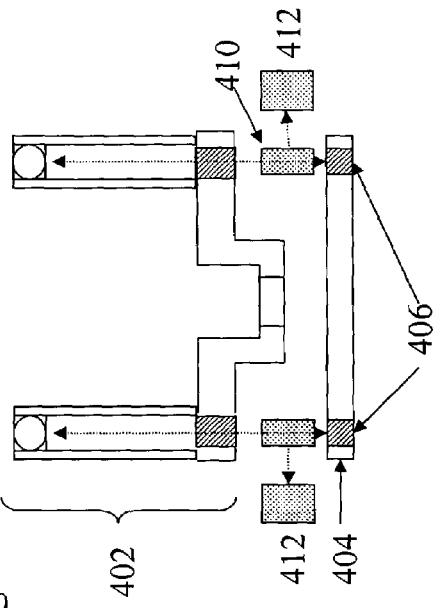
FIGS. 4a to 4c illustrate three different examples of interfacing electro-magnetic sources and detectors with the mask reticle alignment structure in accordance with the present disclosure.
Figure 4A:
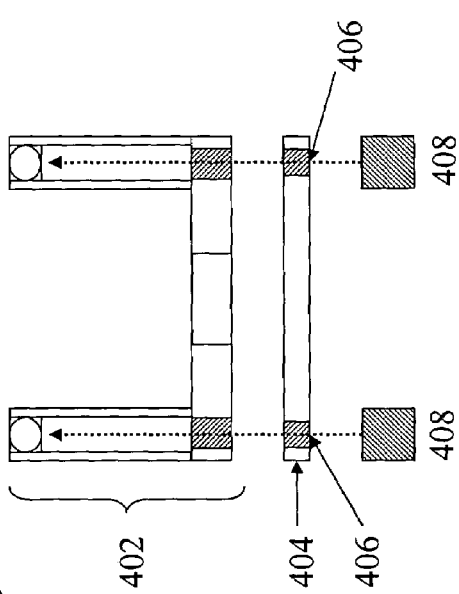
Figure 4B:
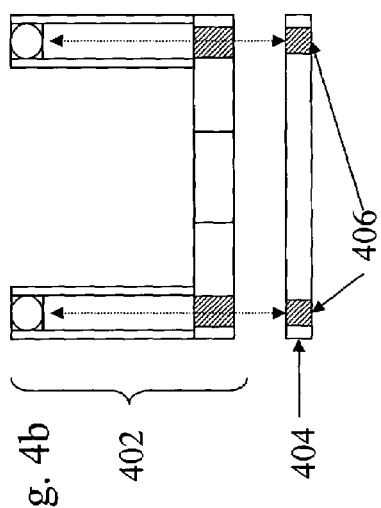

The LEEMR source/detector integration may have different designs. FIGS. 4a through 4c illustrate several examples. FIG. 4a shows a LEEMR source/detector system utilizing LEEMR transmission below the wafer. The mask reticle LEEMR alignment assembly 402 is shown aligned to the wafer 404's alignment marks 406. Infrared type LEEMR sources 408 are shown located directly below the alignment markers 406 of the wafer 404, pointed to and aligned to the detectors located within the protection shields of the LEEMR alignment assembly 402. In this example, the infrared LEEMR beam is transmitted through the wafer 404's and mask reticle's alignment markers to determine the mask reticle-to-wafer positioning. It is noted that the base substrate material used for alignment areas of the mask reticle and wafers 404 can work with the infrared LEEMR. Such materials may include silicon and quartz.

FIG. 4b illustrate a LEEMR source/detector system utilizing LEEMR reflection. The mask reticle LEEMR alignment assembly 402 is shown aligned to the wafer 404's alignment marks 406. The LEEMR sources and detectors are both located within the protection shields of the LEEMR alignment assembly 402. In this example, the LEEMR beam is transmitted through the alignment areas of the mask reticle to the wafer's alignment markers 404 and then reflected from the markers back to the LEEMR detectors to determine the mask reticle-to-wafer positioning. It is noted that base substrate material used for alignment areas of the mask reticle is typically quartz and alignment markers 406 of the wafers 404 comprise of reflective material.

FIG. 4c illustrate a LEEMR source/detector system utilizing side LEEMR reflection technique. The mask reticle LEEMR alignment assembly 402 is shown aligned to the wafer 404's alignment marks 406. The LEEMR sources and detectors are physically separated with the sources located within the protection shields of the LEEMR alignment assembly 402 and the detectors located outside of the protection shields. In this example, the LEEMR beam is transmitted through the alignment area of the mask reticle to the wafer's alignment markers 404 and then reflected from the markers back up towards the LEEMR alignment assembly. A split-level mirror assembly 410 is located in the LEEMR beam path between the mask reticle and wafer 404 to redirect the LEEMR beam reflected from the wafer to the LEEMR detectors 412 for use to determine mask reticle-to-wafer positioning. In this example, the LEEMR unit 412 can be a multi-function unit providing the function of both as an LEEMR source and as a detector. When it serves the function of an LEEMR source, the radiation does not pass through the alignment area, but reflects the image of the alignment markers back to itself. As such, the shielding and detector combination 308 and 310, although shown, are optional. It is also noted that base substrate material used for the alignment areas of the mask reticle is typically quartz and alignment markers 406 of the wafers 404 comprise of reflective material. The LEEMR alignment assembly 402 may lower its aperture to get closer to the mask reticle 404 in order to reduce the divergence of the high energy particles coming down from the top. This arrangement is especially useful when the LEEMR detectors 412 require a certain distance to be maintained between the aperture and the mask reticle.

Figure 5:
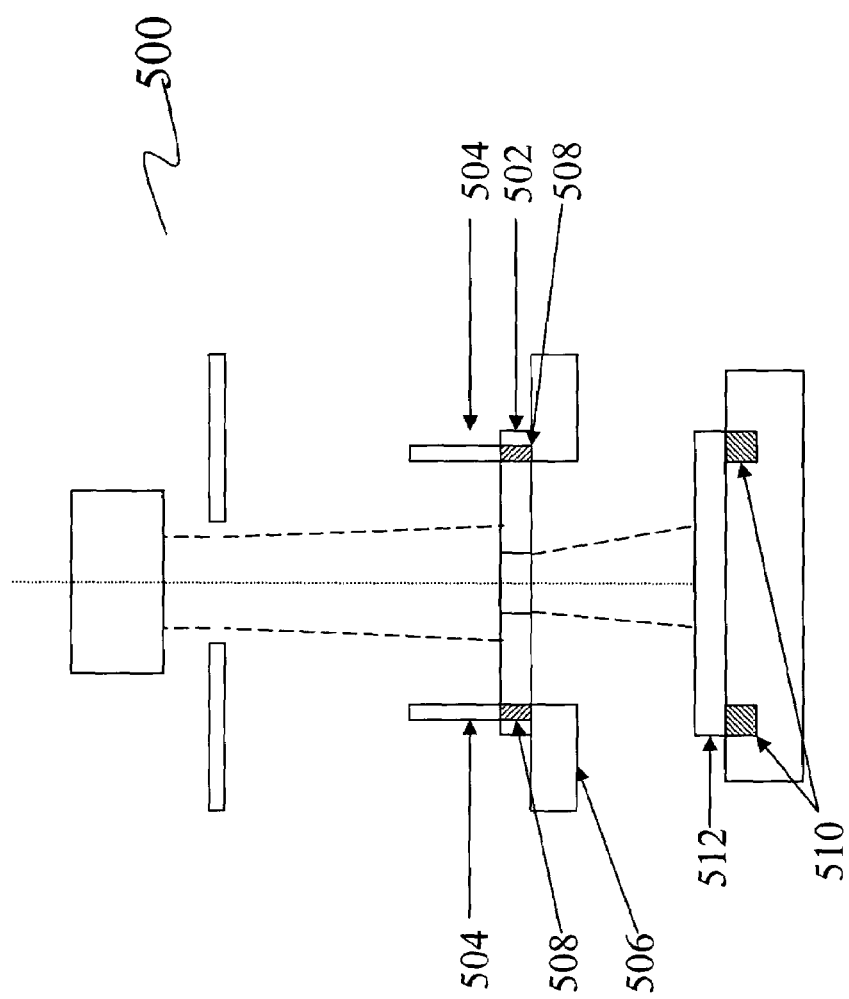
FIG. 5 illustrates a mask reticle integrated with the mask-wafer alignment structure incorporated into a charged particle beam microlithography system according to one example of the present disclosure.

Referring now to FIG. 5, is shown an illustration of a high energy CPB microlithography system 500 with the mask reticle to wafer alignment system integrated in accordance with the present disclosure. The LEEMR source/detector system utilized for this example is of the type as illustrated by FIG. 4a. FIG. 5 shows the mask reticle 502 with the integrated LEEMR alignment assembly 504 installed onto the mask reticle stage 506. The mask reticle's alignment markers 508 are shown aligned to the infrared LEEMR sources 510 located under the wafer 512.

FIGS. 6a through 6d illustrate side sectional views of several mask reticle design examples in accordance with the present disclosure that are compatible with high energy CPB microlithography systems. These examples feature design aspects to control the transmission of and the exposure of the proper collective CPB energy through each predetermined mask target area onto the targeted wafer. Note that for each example, the LEEMR alignment assembly previously described within the present disclosure is not shown for the convenience of focusing this discussion upon the mask reticle features.

Figure 6A:
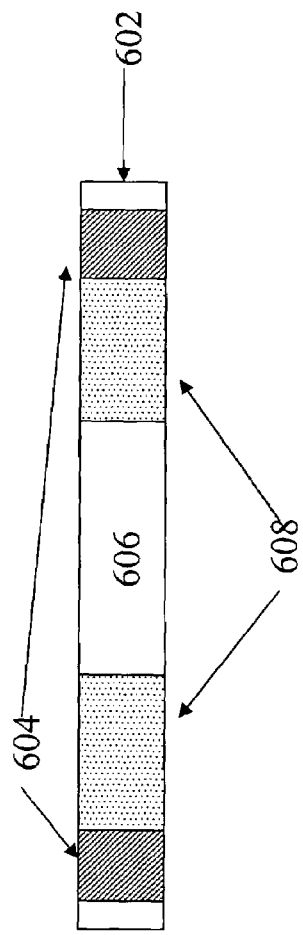

FIG. 6a shows a mask reticle 602 with alignment markers 604. The mask target area 606 is constructed of material that allows for some predetermined amount of CPB energy to transmit through the mask and towards the targeted wafer. It is noted that in order for the CPB to pass through the material, the material must possess enough collective energy transmissive characteristics to exceed a minimum threshold. As example, for applications where semi-insulator regions are created by proton beams, the threshold energy range expected to be received on the wafer may be between 1–5 MeV, and preferably to be around or above 3 MeV. To that end, the mask target area can either be an aperture, or made from selected material, that will induce less than 30% loss of the beam energy. Such materials may comprise of elements such as Silicon, Tungsten, Aluminum or compounds such as $SiO_2$ and $Al_2O_3$, or any combination thereof. There is at least a second area 608 surrounding the mask target area, comprised of a different material that allows a different, usually much less, amount of CPB to transmit through predetermined areas of the mask target area.

Figure 6B:
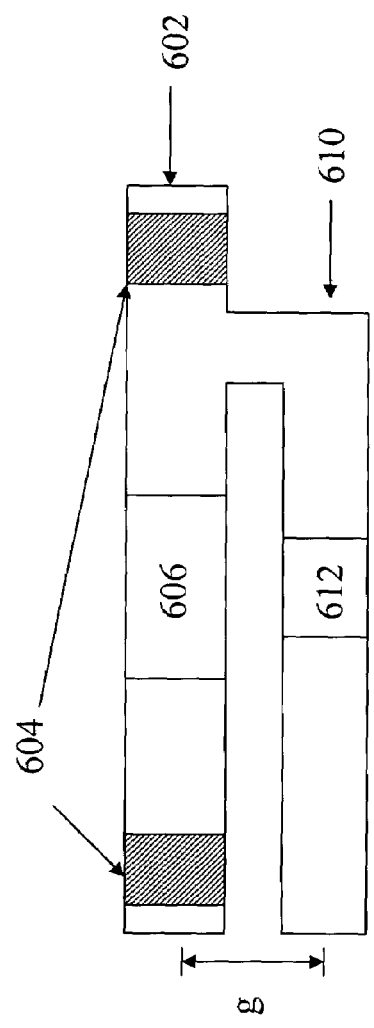

FIG. 6b illustrates a mask reticle with split-level mask target areas separated by a predetermined distance "g". The primary mask reticle substrate 602 is shown with a mask target area 606. An additional mask reticle substrate 610 with a separate mask target area 612 thereon is shown branched away from the primary mask reticle 602 to form an additional, second level mask reticle 610 parallel to the main mask reticle 602. The second level mask reticle 610 may not need an additional target alignment marker if the alignment can be done properly by the marker 604 on the primary mask reticle. For this example, the CPB is transmitted through both mask target areas 606 and 612. It is noted that this example shows mask target area 606 is larger than the mask target area 612 so that the CPB can be selectively focused. This may be referred to as "downsizing" the mask target areas.

The split-level mask reticle design allows for the shortening of the distance from the imaged CPB to the targeted wafer. This shortened distance allows for improved image quality onto the wafer through the minimizing and control of CPB divergence and scatter, as the particles exit through the mask reticles. As such, there is a lesser degree of lateral spreading when the beam lands on the wafer. In short, the multi-mask target areas of the split-level design allow for flexibility for the control of beam size and focus as the CPB is transmitted and projected through each level onto the targeted wafer.

FIG. 6c illustrates a mask reticle design similar to FIG. 6b. In this example, the mask reticle also features split-levels 602 and 616 separated by a predetermined distance "d". The mask target area 618 of this example may be positioned entirely on one level, but also possible to have two mask target areas with one on each of the split-levels 614 and 616. Since there is one continuous mask target reticle extended in the direction normal to the oncoming CPB, one alignment marker 604 may be sufficient. This mask reticle design also allows for the shortening of the distance between the exited imaged CPB and the targeted wafer for minimizing CPB divergence and scatter.

FIG. 6d shows an example of a mask reticle design using stacked mask reticles and stacked mask target areas. The first mask reticle 602 with its mask target area 606 is shown with three additional mask reticle-target areas, 620–622, 626–628 and 632–634 stacked onto each other. The target areas may be made of different materials so that the "passing rates" of the high energy particles are different. The combined mask target areas of all mask reticles define the net mask target area 638. As shown, the net mask target area 638 may be different from some mask target areas of the mask reticles stacking above the last mask 632, although the easiest arrangement is to have all mask reticles with identical mask target areas for stacking. As it can be appreciated by one skilled in the art, the arrangement to stack mask reticles with different sizes of the mask target areas, different thicknesses, different materials, or different locations of the mask target areas can be designed to fit the need of the use. Each individual mask reticle may feature at least one alignment marker 604, 624, 630, 636 used with the previously described alignment system to align mask target areas to the mask target areas of the other mask reticles, and to the targeted wafer. The use of a mask reticle with stacked mask target also allows for the control and shortening of the distance between the CPB and the targeted wafer. The use of separate mask target areas on separate mask reticles also allows for additional flexibility in defining CPB size, focus and image pattern.

The present disclosure described above provides a viable system and methodology for the usage of high energy charged particle beams in microlithography systems. The disclosed mask reticle alignment assembly incorporating low energy electromagnetic sources and detectors provides an improved mechanism for checking and maintaining mask reticle-to-wafer alignment. The shielding feature of the disclosed system assembly allows for the efficient dissipation of heat generated from the use of high energy particle beams, as well as providing radiation shielding from nuclear radiation generated by the high energy beams. It is noticed that the mask reticle does not have to be exposed to the low energy electromagnetic source and the high energy charged particle beams at the same time. For example, the LEEMR source may move away from the mask reticle during the exposure to the high energy charged particle beams. Moreover, the electromagnetic source may be one that is versatile to generate both high and low energy beams. It is further noticed that the shielding feature of the disclosed system may be entirely optional to some practices due to various implementation concerns in the factory.

The mask reticle design methods described by the disclosure provide flexible means to better control the transmission and integrity of the imaged high energy charged particle beams projected upon the targeted wafers. Multi-level and stacked mask reticle designs allow for the adjustment of the mask target area-to-substrate wafer distances, thereby controlling the particle beam divergence issues associated with higher energy particles. The use of dissimilar materials, apertures, multi-level and stacked mask reticles provide a variety of means for detailed exposure control of the high energy particle beam within the defined pattern images. The combined usage of the disclosed mask reticle alignment assembly incorporating electromagnetic sources and detectors with the new mask reticle design methods greatly improves the process integrity, reliability and control of high energy particle beam fabrication for the high performance integrated circuits.

The described systems and methods of the present disclosure may be compatible and used within existing microlithography systems, including scanner, stepper and contact lithography systems. This compatibility allows for easy implementation into currently existing IC fabrication operations. It is also noted that the system and methods used in accordance with the present disclosure are applicable to future generations of microlithography systems and process technologies, as well as to the older systems and technologies.

The above disclosure provides many different embodiments, or examples, for implementing different features of the invention. Specific examples of components, and processes are described to help clarify the invention. These are, of course, merely examples and are not intended to limit the invention from that described in the claims.

While the invention has been particularly shown and described with reference to the preferred embodiment thereof, it will be understood by those skilled in the art that various changes in form and detail may be made therein without departing from the spirit and scope of the invention, as set forth in the following claims.

What is claimed is:

1. A system for concentrating high energy particles on a predetermined area on a target semiconductor substrate, comprising:
    a high energy source for generating a predetermined amount of high energy particles;
    an electro-magnetic radiation source for generating one or more low energy beams; and
    a mask set exposed to the high energy source and the electro-magnetic radiation source, the mask set having at least one mask with at least one alignment area and at least one mask target area thereon, the mask target area passing more high energy particles than any other area of the mask,
    wherein the mask is aligned with the predetermined target semiconductor substrate using the low energy beams,
    wherein the high energy particles generated by the high energy source pass through the mask target area to land on the predetermined area on the target semiconductor substrate, and
    wherein the predetermined area receives the high energy particles with a collective energy exceeding a predetermined threshold;
    wherein the predetermined threshold is in a range between 1 to 5 MeV.

2. The system of claim 1 further comprising at least one protection shield for protecting the alignment area from being exposed to the high energy particles.

3. The system of claim 2 wherein the protection shield includes one or more heat sinks fixed on the mask without blocking the alignment area for dissipating heat energy generated by the high energy particles.

4. The system of claim 2 wherein the protection shield is attached to the electro-magnetic radiation source.

5. A method for transforming a part of the target semiconductor substrate to be a non-semiconductor material using the system of claim 1, comprising:
    generating one or more low energy beams by the electro-magnetic radiation source for aligning the at least one mask with the predetermined target semiconductor substrate;
    generating the predetermined amount of high energy particles by the high energy source; and
    passing the high energy particles generated by the high energy source through the mask target area of the mask to land on the predetermined area on the predetermined target semiconductor substrate for transforming the semiconductor material thereon to be the non-semiconductor material after the predetermined area receives the high energy particles with the collective energy level exceeding the predetermined threshold.

6. The method of claim 5 further comprising dissipating heat energy generated by the high energy particles on the mask.

7. The method of claim 6 wherein the dissipating further includes attaching one or more heat sinks on the mask without blocking an alignment area of the mask and the mask target area.

8. The method of claim 5 wherein the mask set has one or more masks with their corresponding mask target areas aligned in sequence for downsizing the mask target areas sequentially thereby concentrating the high energy particles on the predetermined area.

9. The method of claim 8 wherein the mask target areas of the one or more masks have different passing rates for the high energy particles.

10. The method of claim 5 further comprising confining and absorbing radiations caused by the high energy particles.

11. The method of claim 5 wherein the mask target area is an aperture.

12. The method of claim 5 wherein the mask target area is made of a material that is different from the rest of the mask with an improved particle passing rate to assure that the collective energy exceeds the predetermined threshold.

13. The method of claim 5 wherein the predetermined threshold is above 1 MeV.

14. A system for concentrating high energy particles on a predetermined area on a target semiconductor substrate, comprising:
   a high energy source for generating a predetermined amount of high energy particles;
   an electro-magnetic radiation source for generating one or more low energy beams; and
   a mask set exposed to the high energy source and the electro-magnetic radiation source, the mask set having at least one mask with at least one alignment area and at least one mask target area thereon, the mask target area passing more high energy particles than any other area of the mask,
   at least one protection shield for protecting the alignment area from being exposed to the high energy particles,
   wherein the mask is aligned with the predetermined target semiconductor substrate using the low energy beams,
   wherein the high energy particles generated by the high energy source pass through the mask target area to land on the predetermined area on the target semiconductor substrate, and
   wherein the predetermined area receives the high energy particles with a collective energy exceeding a predetermined threshold;
   wherein the protection shield is attached to the mask.

15. A system for concentrating high energy particles on a predetermined area on a target semiconductor substrate, comprising:
   a high energy source for generating a predetermined amount of high energy particles;
   an electro-magnetic radiation source for generating one or more low energy beams; and
   a mask set exposed to the high energy source and the electro-magnetic radiation source, the mask set having at least one mask with at least one alignment area and at least one mask target area thereon, the mask target area passing more high energy particles than any other area of the mask,
   wherein the mask is aligned with the predetermined target semiconductor substrate using the low energy beams,
   wherein the high energy particles generated by the high energy source pass through the mask target area to land on the predetermined area on the target semiconductor substrate, and
   wherein the predetermined area receives the high energy particles with a collective energy exceeding a predetermined threshold;
   wherein the mask set has one or more masks with their corresponding mask target areas aligned in sequence for sequentially downsizing a resulting area for passing the high energy particles, thereby concentrating the high energy particles on the predetermined area.

16. The system of claim 1 wherein the mask target area is an aperture.

17. The system of claim 1 wherein the mask target area is made of a material that is different from the rest of the mask with an improved particle passing rate to assure that the collective energy exceeds the predetermined threshold.

18. The system of claim 17 wherein the mask target area is made of a thin material selected from a group consisting of Si based material, Al based material, and W based material.

19. The system of claim 17 wherein the rest of the mask is made of a Quartz based material.

20. The system of claim 17 wherein the rest of the mask is made of a silicon oxide based material.

21. A system for concentrating high energy particles on a predetermined area on a target semiconductor substrate, comprising:
   a high energy source for generating a predetermined amount of high energy particles;
   an electro-magnetic radiation source for generating one or more low energy beams; and
   a mask set exposed to the high energy source and the electro-magnetic radiation source, the mask set having at least one mask with at least one alignment area and at least one mask target area thereon, the mask target area passing more high energy particles than any other area of the mask,
   wherein the mask is aligned with the predetermined target semiconductor substrate using the low energy beams,
   wherein the high energy particles generated by the high energy source pass through the mask target area to land on the predetermined area on the target semiconductor substrate, and
   wherein the predetermined area receives the high energy particles with a collective energy exceeding a predetermined threshold;
   wherein the predetermined threshold is above 3 MeV.

22. A system for forming a semi-insulator area on a target semiconductor substrate, comprising:
   a high energy source for generating a predetermined amount of high energy particles;
   an electro-magnetic radiation source for generating one or more low energy beams; and
   a mask set having at least one mask with at least one alignment area and at least one mask target area thereon, the mask target area passing more high energy particles then any other area of the mask,
   wherein the mask is aligned with the predetermined target semiconductor substrate by using the low energy beams, and
   wherein the high energy particles generated by the high energy source with a collective energy exceeding a predetermined threshold pass through the mask target area to transform the predetermined area on the target semiconductor substrate into the semi-insulator area;
   wherein the predetermined threshold is above 3 MeV.

23. A system for forming a semi-insulator area on a target semiconductor substrate, comprising:
   a high energy source for generating a predetermined amount of high energy particles;
   an electro-magnetic radiation source for genera ting one or more low energy beams; and
   a mask set having at least one mask with at least one alignment area and at least one mask target area thereon, the mask target area passing more high energy particles then any other area of the mask,
   wherein the mask is aligned with the predetermined target semiconductor substrate by using the low energy beams, and
   wherein the high energy particles generated by the high energy source with a collective energy exceeding a predetermined threshold pass through the mask target area to transform the predetermined area on the target semiconductor substrate into the semi-insulator area;

wherein the mask set has one or more masks with their corresponding mask target areas aligned in sequence for sequentially downsizing a resulting area for passing the high energy particles, thereby concentrating the high energy particles on the predetermined area.

24. The system of claim 22 wherein the mask target area is an aperture.

25. The system of claim 22 wherein the mask target area is made of a material that is different from the rest of the mask with an improved particle passing rate to assure that the collective energy exceeds the predetermined threshold.

26. The system of claim 25 wherein the mask target area is made of a thin material selected from a group consisting of Si based material, Al based material, and W based material.

27. The system of claim 26 wherein the rest of the mask is made of a Quartz or silicon oxide based material.

28. A system for forming a semi-insulator area on a target semiconductor substrate, comprising:

a high energy source for generating a predetermined amount of high energy particles;

an electro-magnetic radiation source for generating one or more low energy beams; and a mask set having at least one mask with at least one alignment area and at least one mask target area thereon, the mask target area passing more high energy particles then any other area of the mask, wherein the mask is aligned with the predetermined target semiconductor substrate by using the low energy beams, and wherein the high energy particles generated by the high energy source with a collective energy exceeding a predetermined threshold pass through the mask target area to transform the predetermined area on the target semiconductor substrate into the semi-insulator area;

wherein the predetermined threshold is in a range between 1 and 5 MeV.

29. The system of claim 22 further comprising at least one protection shield inserted between the electro-magnetic radiation source and the mask set for protecting the alignment area of the mask from being exposed to the high energy particles.

30. The system of claim 29 wherein the protection shield is attached to the electro-magnetic radiation source.

31. A system for forming a semi-insulator area on a target semiconductor substrate, comprising:

a high energy source for generating a predetermined amount of high energy particles;

an electro-magnetic radiation source for generating one or more low energy beams; and a mask set having at least one mask with at least one alignment area and at least one mask target area thereon, the mask target area passing more high energy particles then any other area of the mask, at least one protection shield inserted between the electro-magnetic radiation source and the mask set for protecting the alignment area of the mask from being exposed to the high energy particles;

wherein the mask is aligned with the predetermined target semiconductor substrate by using the low energy beams, and wherein the high energy particles generated by the high energy source with a collective energy exceeding a predetermined threshold pass through the mask target area to transform the predetermined area on the target semiconductor substrate into the semi-insulator area;

wherein the protection shield is attached to the mask.

32. The system of claim 31 wherein the protection shield includes one or more heat sinks fixed on the mask without blocking the alignment area for dissipating heat energy generated by the high energy particles.

* * * * *